(12) United States Patent
Schicktanz (10) Patent No.: US 9,748,519 B2
(45) Date of Patent: Aug. 29, 2017

(54) OPTOELECTRONIC COMPONENT

(71) Applicant: OSRAM OLED GmbH, Regensburg (DE)

(72) Inventor: Simon Schicktanz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/888,395

(22) PCT Filed: May 19, 2014

(86) PCT No.: PCT/EP2014/060243
§ 371 (c)(1),
(2) Date: Oct. 30, 2015

(87) PCT Pub. No.: WO2014/184387
PCT Pub. Date: Nov. 20, 2014

(65) Prior Publication Data
US 2016/0079563 A1    Mar. 17, 2016

(30) Foreign Application Priority Data

May 17, 2013 (DE) .................... 10 2013 105 128

(51) Int. Cl.
*H01L 29/08* (2006.01)
*H01L 51/52* (2006.01)
*H01L 51/44* (2006.01)

(52) U.S. Cl.
CPC ........ *H01L 51/5253* (2013.01); *H01L 51/448* (2013.01); *H01L 51/524* (2013.01)

(58) Field of Classification Search
CPC ........... H01L 27/32; H01L 2924/12044; H01L 51/5287
See application file for complete search history.

(56) References Cited

U.S. PATENT DOCUMENTS

| 8,633,585 B2 | 1/2014 | Schmid et al. |
| 2006/0279209 A1* | 12/2006 | Yamaguchi ......... H01L 51/5259 313/512 |
| 2008/0220151 A1 | 9/2008 | Kataoka |
| 2012/0132953 A1 | 5/2012 | Becker et al. |
| 2014/0093700 A1 | 4/2014 | Han et al. |
| 2014/0246665 A1 | 9/2014 | Lang et al. |
| 2015/0036343 A1 | 2/2015 | Sorg et al. |

FOREIGN PATENT DOCUMENTS

| CN | 102179971 A | 9/2011 |
| DE | 102009042795 A1 | 4/2011 |
| DE | 102011077614 A1 | 12/2012 |
| DE | 10201184276 A1 | 4/2013 |

(Continued)

*Primary Examiner* — Elias M Ullah
(74) *Attorney, Agent, or Firm* — Slater Matsil, LLP (57) ABSTRACT

An optoelectronic component includes a substrate, a first electrode on the substrate, a radiation-emitting or radiation-absorbing layer sequence on the first electrode, a second electrode on the layer sequence, an encapsulation layer on the second electrode, and a covering layer on the encapsulation layer. The covering layer has a first main surface and second main surface. At least one intended rupture surface is provided between the first and the second main surface of the covering layer.

15 Claims, 9 Drawing Sheets

(56) References Cited

FOREIGN PATENT DOCUMENTS

| | | | |
|---|---|---|---|
| JP | 2002164164 | A | 6/2002 |
| JP | 2004303529 | A | 10/2004 |
| JP | 102011084276 | A1 | 4/2013 |
| WO | 2009024892 | A1 | 2/2009 |
| WO | 2009095006 | A1 | 8/2009 |
| WO | 2010108894 | A1 | 9/2010 |

\* cited by examiner

OPTOELECTRONIC COMPONENT

This patent application is a national phase filing under section 371 of PCT/EP2014/060243, filed May 19, 2014, which claims the priority of German patent application 10 2013 105 128.6, filed May 17, 2013, each of which is incorporated herein by reference in its entirety.

TECHNICAL FIELD

An optoelectronic component comprising a radiation-emitting or radiation-absorbing layer sequence is specified.

BACKGROUND

Optoelectronic components such as, for example, organic light-emitting diodes (OLEDs) or organic solar cells usually have a thin-film encapsulation that is intended to protect the electrodes and the radiation-emitting or radiation-absorbing layer sequence of the optoelectronic component against moisture and oxidizing substances such as oxygen, for instance. For mechanical protection of the thin-film encapsulation, an additional cover substrate layer is often applied to the thin-film encapsulation, which can consist of glass, for example. In the event of a mechanical loading of the optoelectronic component, a delamination of the cover substrate layer can occur, as a result of which the thin-film encapsulation can be damaged and the functioning of the optoelectronic component can be impaired.

SUMMARY

Specific embodiments specify an optoelectronic component comprising a radiation-emitting or radiation-absorbing layer sequence in which damage to the thin-film encapsulation is reduced or avoided in specific cases.

An optoelectronic component in accordance with one embodiment comprises in particular a substrate, a first electrode on the substrate, a radiation-emitting or radiation-absorbing layer sequence on the first electrode, a second electrode on the layer sequence, an encapsulation layer arranged on the second electrode, and a covering layer arranged on the encapsulation layer and having a first and a second main surface, wherein at least one predetermined breaking surface is provided between the first and the second main surface of the covering layer.

In this case, the fact that one layer or one element is arranged or applied "on" or "above" another layer or another element can mean here and hereinafter that said one layer or said one element is arranged directly in direct mechanical and/or electrical contact on the other layer or the other element. Furthermore, it can also mean that said one layer or said one element is arranged indirectly on or above the other layer or the other element. In this case, further layers and/or elements can then be arranged between said one layer and the other layer.

The covering layer need not be shaped homogeneously, but rather can consist, for example, of a plurality of individual layer elements. First and second main surfaces of the covering layer are taken to mean the two largest boundary surfaces of the covering layer, which is preferably shaped in a planar fashion, for example, the two side surfaces having the largest surface area in the case of a covering layer shaped in a plate-shaped fashion. If the covering layer is arranged directly on the encapsulation layer, then the first main surface preferably coincides with the interface between the covering layer and the encapsulation layer. If no further elements are arranged on the covering layer, then the second main surface forms a terminating surface of the optoelectronic component. Preferably, the two main surfaces run parallel to one another.

Predetermined breaking surface is taken to mean a surface at which the material of the covering layer yields mechanically if the optoelectronic component is subjected to a mechanical loading. This concerns, in particular, a mechanical loading in a region of the optoelectronic component which comprises at least one part of the encapsulation layer and of the covering layer. Mechanical loading is taken to mean, in particular, a state in which deformation forces such as, for example, shear stresses or tensile stresses occur which are above a specific critical threshold. The predetermined breaking surface need not necessarily be shaped in a planar fashion and also need not necessarily run parallel to one of the two main surfaces of the covering layer. Likewise, the predetermined breaking surface need not extend over the entire area of the covering layer, but rather can be arranged only in partial regions thereof.

It is important that the predetermined breaking surface runs in the interior of the covering layer, and in particular not at a main surface of the covering layer facing the encapsulation layer. What is achieved as a result is that mechanical damage to the encapsulation layer is reduced or completely avoided, such that the optoelectronic component, for example, after partial delamination of the covering layer, is still completely usable since the encapsulation layer is still intact and also the mechanical protection afforded by the covering layer still remains.

In one preferred embodiment, the predetermined breaking surface extends parallel to the first main surface and/or to the second main surface of the covering layer and/or to the interface between the covering layer and the encapsulation layer. It is at least preferred for an angle between a normal vector of the predetermined breaking surface and a normal vector of the first main surface and/or a normal vector of the second main surface of the covering layer and/or a normal vector of the interface between the covering layer and the encapsulation layer to be less than 30°, in particular less than 15°.

In one preferred embodiment, the covering layer is arranged directly on the encapsulation layer. By virtue of the fact that the predetermined breaking surface runs in the interior of the covering layer, what is achieved is that the interface between the encapsulation layer and the covering layer in the event of a mechanical loading remains largely or completely undamaged and the two layers are not torn away from one another.

Upon the occurrence of a tensile stress that exceeds a critical threshold, therefore, the separation or detachment of partial regions of the optoelectronic component from one another takes place neither within the encapsulation layer nor at an interface between the encapsulation layer and the covering layer, but rather in a region which is arranged on that side of the interface which faces away from the encapsulation layer between the encapsulation layer and the covering layer (for example, as a result of cohesion failure or adhesion failure).

The first electrode and/or the second electrode can be embodied in a planar fashion or particularly preferably in a large-area fashion. In this case, in a large-area fashion can mean that the first electrode and/or the second electrode have/has an area of greater than or equal to a few square millimeters, preferably greater than or equal to one square centimeter, and particularly preferably greater than or equal to one square decimeter.

Alternatively, the first electrode and/or the second electrode can be embodied in a manner structured into first and/or second electrode partial regions. By way of example, the first electrode can be embodied in the form of first electrode strips arranged parallel alongside one another, and the second electrode as second electrode strips arranged parallel alongside one another and preferably running perpendicularly to the first electrode strips. Overlaps of the first and second electrode strips can thus be embodied as separately drivable luminous regions. Furthermore, it is also possible for only the first or only the second electrode to be structured. Particularly preferably, the first and/or the second electrode or electrode partial regions are electrically conductively connected to first conductor tracks. In this case, an electrode or an electrode partial region can, for example, merge into a first conductor track or be embodied separately from a first conductor track and be electrically conductively connected thereto.

The encapsulation layer can cover the entire layer sequence with the electrodes. Furthermore, it can cover at least one part of the surface of the substrate on which the layer sequence with the first and second electrodes are arranged. In addition, it can also enclose the entire substrate.

In accordance with a further embodiment, it is provided that the layer sequence comprise one or a plurality of functional layers composed of organic material. In particular, the optoelectronic component can be embodied as an organic light-emitting diode (OLED) or as an organic solar cell, depending on whether the layer sequence is embodied in a radiation-emitting or radiation-absorbing fashion.

By way of example, a functional region comprising one or a plurality of functional layers composed of organic materials can be applied above the first electrode. In this case, the functional layers can be embodied, for example, as electron transport layers, electroluminescent layers and/or hole transport layers. A second electrode can be applied above the functional layers. In the functional layers, electromagnetic radiation having an individual wavelength or a range of wavelengths can be generated in an active region by means of electron and hole injection and recombination.

The functional layers can comprise organic polymers, organic oligomers, organic monomers, organic small, non-polymeric molecules ("small molecules") or combinations thereof. Suitable materials and also arrangements and structurings of the materials for functional layers are known to the person skilled in the art and therefore will not be explained any further at this juncture.

However, the optoelectronic component can also comprise a semiconductor layer sequence as radiation-emitting or radiation-absorbing layer sequence.

The second electrode, the encapsulation layer and the covering layer can be embodied in a transparent fashion, such that the optoelectronic component is embodied as a so-called "top emitter". In addition, the optoelectronic component can be embodied as a so-called "bottom emitter" if the substrate and the first electrode are embodied in a transparent fashion. Moreover, the optoelectronic component can be embodied both as a "top emitter" and as a "bottom emitter".

In accordance with a further embodiment, it is provided that the encapsulation layer is designed to protect the electrodes and the layer sequence against moisture and/or atmospheric oxygen.

The encapsulation layer is preferably a so-called thin-film encapsulation layer that is formed from one or a plurality of thin films. Thin-film encapsulation layers are known, for example, from the documents WO 2009/095006 A1 (U.S. counterpart is published as U.S. Pat. No. 8,633,585) and WO 2010/108894 A1 (U.S. counterpart is published as U.S. 2012/0132953), the respective disclosure content of which in this regard is hereby incorporated by reference in its full scope. In particular, the cited documents disclose suitable materials, layer thicknesses and methods for applying the encapsulation layer, which will therefore not be explained in greater detail here.

The individual layers of the thin-film encapsulation can have, for example, in each case a thickness of between one atomic layer and approximately 1 µm. The total thickness of the encapsulation layer is, for example, less than 10 µm, less than 1 µm or even less than 100 nm. The thin-film encapsulation preferably contains one or a plurality of metal oxide layers.

The encapsulation layer is advantageously applied by means of plasma-enhanced chemical vapor deposition (PE-CVD), atomic layer deposition (ALD), molecular layer deposition (MLD) or thermal evaporation.

Preferably, the encapsulation layer forms a barrier layer or comprises at least one barrier layer. In particular, the barrier layer can be impermeable to oxygen and/or moisture or penetrable only with difficulty with respect thereto. By way of example, the barrier layer can comprise an oxide, a nitride or an oxynitride. By way of example, the oxide, nitride or oxynitride can furthermore comprise aluminum, silicon, tin or zinc. In this case, the barrier layer can have dielectric or else electrically conductive properties and comprise, for example, silicon oxide, for instance $SiO_2$, silicon nitride, for instance $Si_2N_3$, silicon oxynitride ($SiO_xN_y$), aluminum oxide, for instance $Al_2O_3$, aluminum nitride, tin oxide, indium tin oxide, zinc oxide or aluminum zinc oxide. Alternatively or additionally, the barrier layer can comprise a material which is suitable for binding oxygen and/or moisture and thereby preventing it/them from penetrating through the barrier layer. Suitable materials for this can be alkali and alkaline earth metals, for example.

The barrier layer can be producible, for example, by an application method such as a vapor deposition or deposition method, for instance. Such an application method can be a method for chemical vapor deposition (CVD) or a method for physical vapor deposition (PVD) or a combination of such methods. Thermal evaporation, electron beam evaporation, laser beam evaporation, arc evaporation, molecular beam epitaxy, sputtering, ion plating and plasma-enhanced chemical vapor deposition shall be mentioned as examples of such application methods.

The encapsulation layer can also comprise a plurality of barrier layers. In this case, here and hereinafter "a plurality of layers" can mean at least two or more layers. In this case, as explained above, the barrier layers can comprise identical or different materials.

In accordance with a further embodiment, it is provided that in the event of a mechanical loading of the optoelectronic component a cohesion failure takes place at the at least one predetermined breaking surface. Preferably, the covering layer is split by cohesion failure if a tensile or shear force acting locally on it exceeds the cohesion force of the covering layer.

In accordance with a further embodiment, it is provided that the covering layer comprises a plurality of individual layer elements, wherein two adjacent individual layer elements are connected to one another via a cohesive connection configured in such a way that the predetermined breaking surface is formed at least partly by an interface between the two adjacent individual layer elements. In this case, the predetermined breaking surface serves for separating the individual layer elements from one another.

In accordance with a further embodiment, it is provided that in the event of a mechanical loading of the optoelectronic component an adhesion failure takes place at the interface between the two adjacent individual layer elements.

In accordance with a further embodiment, it is provided that the covering layer is arranged directly on the encapsulation layer and an adhesion force between the covering layer and the encapsulation layer is high enough that the covering layer remains adhering to the encapsulation layer in the event of a mechanical loading of the optoelectronic component.

This does not necessarily mean that the entire covering layer remains adhering to the encapsulation layer. Rather, it suffices for at least one partial layer of the covering layer, one main surface of which coincides with the interface between covering layer and encapsulation layer, to remain adhering to the encapsulation layer, such that the interface between covering layer and encapsulation layer is not damaged.

In accordance with a further embodiment, it is provided that the covering layer comprises an adhesive layer and a cover substrate layer arranged on the adhesive layer.

In the context of the present invention, the term adhesive layer should be understood functionally rather than merely in the narrow sense of an adhesive. Adhesive action is accorded to the adhesive layer only as long as a separation between the layers cohesively connected by the adhesive layer has not yet taken place. The adhesive layer can consist of or contain liquid epoxy resin cured by UV irradiation. However, the material of the adhesive layer is not restricted to liquid adhesives. By way of example, an acrylate adhesive can also be involved. Preferably, a layer that promotes adhesion on both main surfaces is involved. Furthermore, it is preferred for a thickness of the adhesive layer to be between 5 μm and 100 μm, particularly preferably between 20 μm and 30 μm.

The cover substrate layer can comprise, for example, one or a plurality of materials in the form of a layer, a plate, a film or a laminate which are selected from glass, quartz, plastic, metal and silicon wafer. Particularly preferably, the cover substrate layer comprises glass, for example, in the form of a glass layer, glass film or glass plate, or is composed thereof. Furthermore, it is preferred for a thickness of the cover substrate layer to be between 0.1 and 4 mm.

In accordance with a further embodiment, it is provided that the adhesive layer is arranged directly on the encapsulation layer and an adhesion force between the adhesive layer and the encapsulation layer is high enough that the adhesive layer remains adhering to the encapsulation layer in the event of a mechanical loading of the optoelectronic component.

This does not necessarily mean that the entire covering layer remains adhering to the encapsulation layer. Rather, it suffices for at least one partial layer of the adhesive layer, one main surface of which coincides with the interface between adhesive layer and encapsulation layer, to remain adhering to the encapsulation layer, such that the interface between adhesive layer and encapsulation layer is not damaged.

What is achieved as a result is that the adhesive layer remains adhering with a sufficient adhesion force preventing the delamination of the adhesive layer from the encapsulation layer, and on the other hand a layer arranged above the interface between the adhesive layer and the encapsulation layer, such as, for example, the adhesive layer itself or an additionally inserted intermediate layer, is split into two partial layers by cohesion failure or two adjacent layers arranged above the interface between the adhesive layer and the encapsulation layer detach from one another as a result of adhesion failure. This measure reduces the risk of the adhesive layer completely or partly detaching from the encapsulation layer and thereby causing damage to the latter.

The adhesive layer thus has optimized adhesion properties with regard to the encapsulation layer, such that the mechanical loading at least in the local region between adhesive layer and encapsulation layer manifests no or only a small effect.

In accordance with a further embodiment, it is provided that in the event of a mechanical loading the entire adhesive layer adheres or remains adhering to the encapsulation layer.

In accordance with a further embodiment, it is provided that in the event of a mechanical loading of the optoelectronic component a cohesion failure takes place in the adhesive layer.

In accordance with a further embodiment, it is provided that the cover substrate layer is arranged directly on the adhesive layer and that in the event of a mechanical loading of the optoelectronic component an adhesion failure takes place at an interface between the adhesive layer and the cover substrate layer.

The fact of whether, during separation, an adhesion failure occurs between the adhesive layer and the cover substrate layer or a cohesion failure occurs within the adhesive layer can be established by means of the material and/or the surface properties of the adhesive layer and of the encapsulation layer.

In accordance with a further embodiment, it is provided that at least one intermediate layer is arranged between the adhesive layer and the cover substrate layer and that in the event of a mechanical loading of the optoelectronic component a cohesion failure takes place in the intermediate layer or an adhesion failure takes place at an interface between the intermediate layer and the adhesive layer or at an interface between the intermediate layer and the cover substrate layer.

BRIEF DESCRIPTION OF THE DRAWINGS

Other advantages and advantageous embodiments and developments of the invention will become apparent from the embodiments described below in association with the figures.

In the figures.

In the exemplary embodiments and figures, identical or identically acting constituent parts may be provided in each case with the same reference signs. The illustrated elements and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

DETAILED DESCRIPTION OF ILLUSTRATIVE EMBODIMENTS

Figure 1:
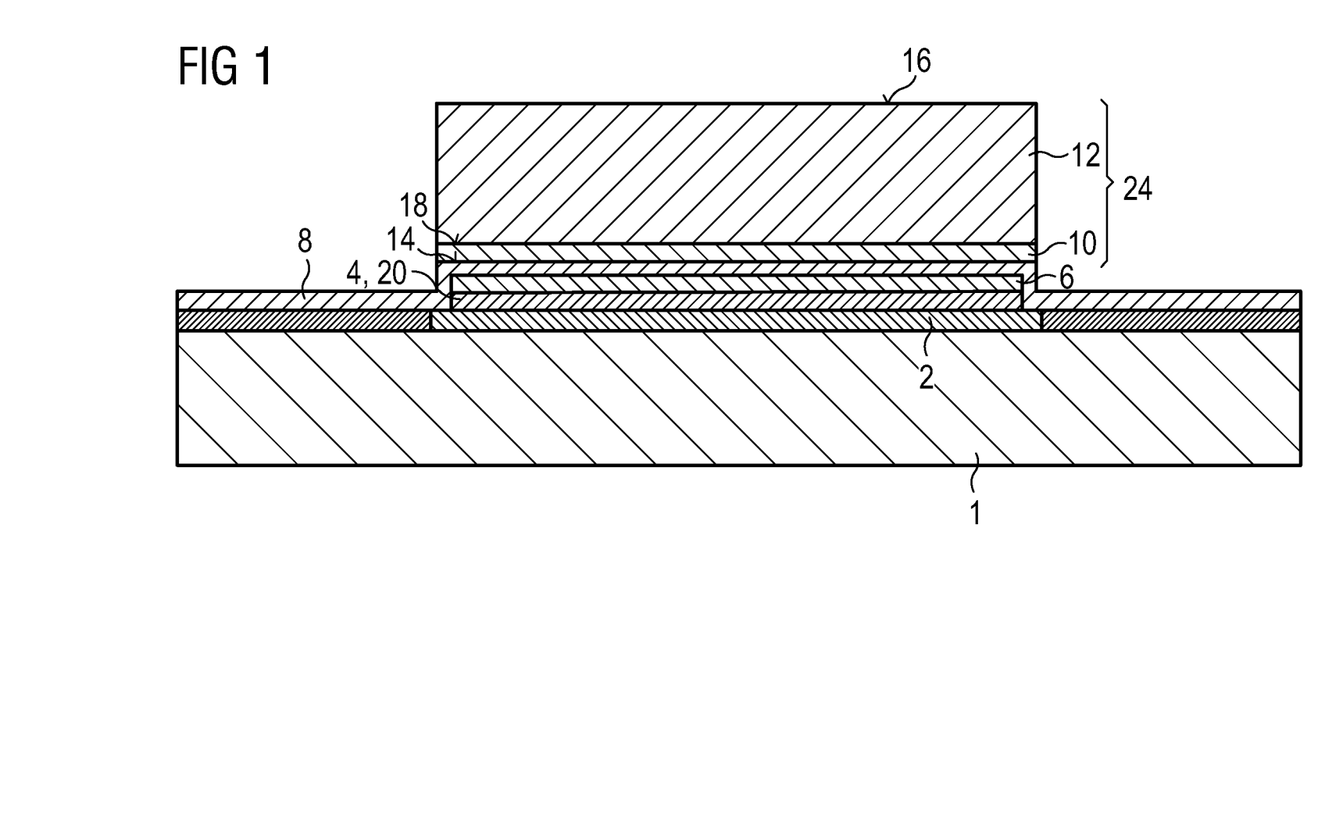
FIG. 1 shows an optoelectronic component in accordance with a first embodiment of the invention.

FIG. 1 shows an optoelectronic component in accordance with a first embodiment of the invention. A first transparent electrode layer 2 is arranged on a substrate layer 1 composed of glass. There is arranged on the first electrode layer 2 a radiation-emitting layer sequence 4, which comprises one or a plurality of functional layers composed of organic material and in which an active region 20 is formed by the latter, said active region emitting electromagnetic radiation during operation. A second electrode layer 6 containing a metal is arranged on the layer sequence 4. The optoelectronic component is thus embodied as an organic light-emitting diode (OLED).

A thin-film encapsulation layer 8 is applied on the second electrode layer 6 and protects the two electrode layers 2, 6 and the layer sequence 4 against moisture and atmospheric oxygen. A lamination adhesive layer 10 is arranged directly on the thin-film encapsulation layer 8 and serves to fix a lamination substrate layer 12 to the thin-film encapsulation layer 8, said lamination substrate layer being arranged directly on the lamination adhesive layer 10 and acting as a cover substrate layer. The lamination adhesive layer 10 is cohesively connected to the thin-film encapsulation layer 8, on the one hand, and to the lamination substrate layer 12, on the other hand. The lamination adhesive layer 10 and the lamination substrate layer 12 together form a covering layer 24, which provides mechanical protection for the thin-film encapsulation layer 8.

The interface between the thin-film encapsulation layer 8 and the lamination adhesive layer 10 coincides with a first main surface 14 of the covering layer 24, and a surface of the lamination substrate layer 12 that faces away from the thin-film encapsulation layer 8 forms the second main surface 16 of the covering layer 24. The interface between the lamination adhesive layer 10 and the lamination substrate layer 12 forms a predetermined breaking surface 18, which thus runs in the interior of the covering layer 24. In the event of a mechanical loading of the optoelectronic component an adhesion failure takes place at the predetermined breaking surface 18.

Figure 2:
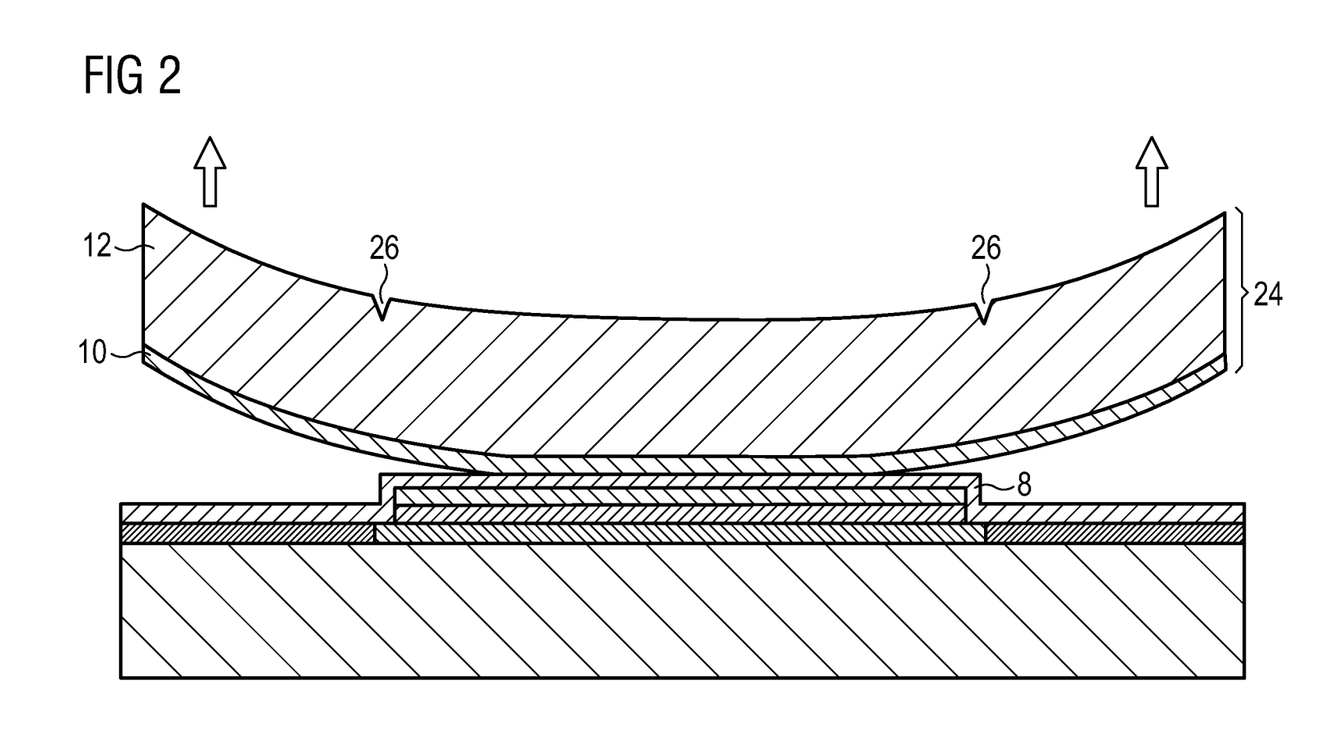
FIGS. 2 and 3 show the effect of a mechanical loading in an optoelectronic component in accordance with the prior art.
Figure 3:
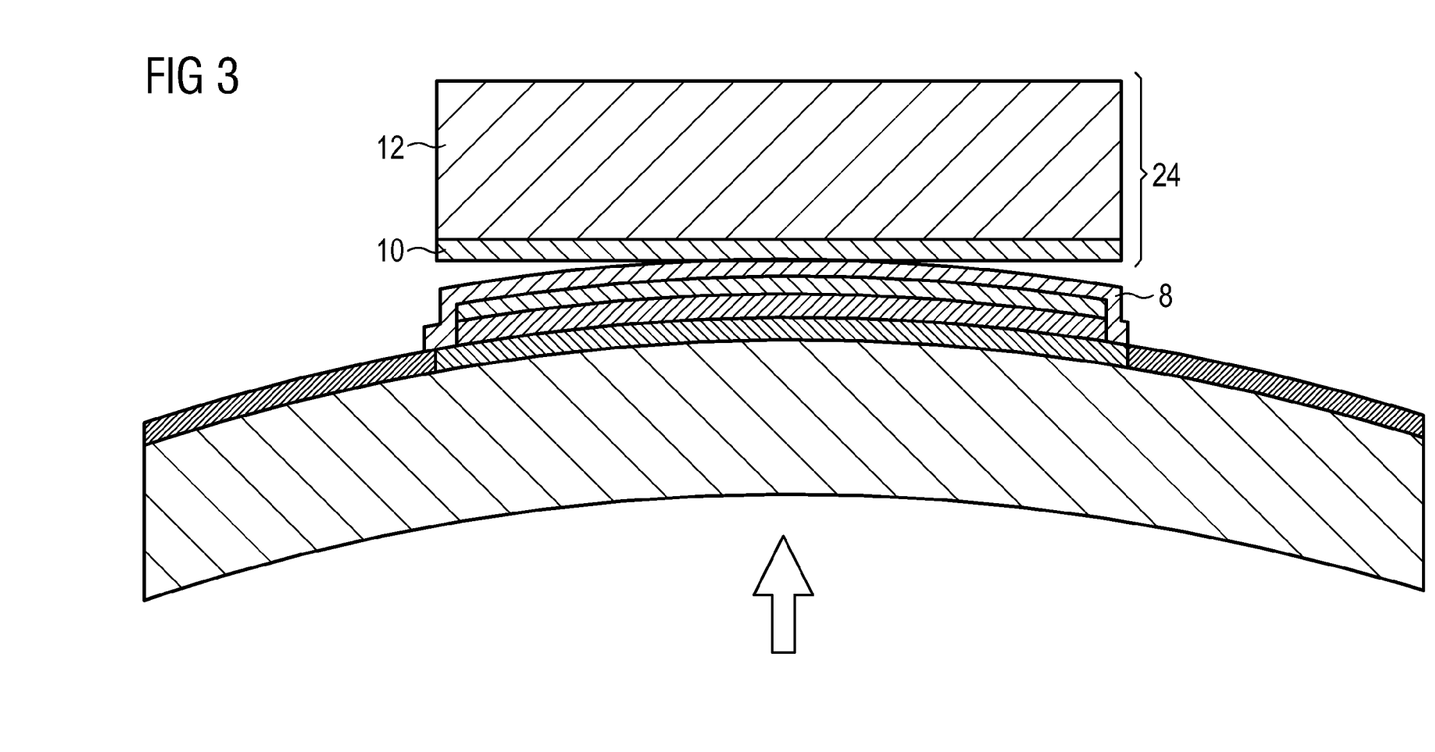

FIGS. 2 and 3 illustrate how a mechanical loading of an optoelectronic component in accordance with the prior art can lead to damage to the thin-film encapsulation layer 8, that is to say if no predetermined breaking surface is provided in the interior of the covering layer 24. As an example of this, FIG. 2 illustrates a situation during the process for producing an optoelectronic component in which the lamination substrate layer 12 is brought to a desired size by a large-area glass layer being fractured along region boundaries 26 mechanically weakened by scribing. The glass layer is raised during the fracturing of the material, as a result of which tensile stresses occur in a region between the thin-film encapsulation layer 8 and the lamination adhesive layer 10 and, upon reaching a critical threshold, detach the lamination adhesive layer 10 from the thin-film encapsulation layer 8. As a result, undesirable damage to the thin-film encapsulation layer 8 can occur, such that afterward moisture or oxygen can penetrate into the interior of the optoelectronic component and impair the functioning thereof.

A similar situation also arises in a finished component as soon as tensile forces act, wherein the tensile forces can arise, for example, if an external force acts on the optoelectronic component, as is identified by an arrow in FIG. 3. Also in this case, an adhesion failure occurs at the interface between the thin-film encapsulation layer 8 and the lamination adhesive layer 10.

Figure 4:
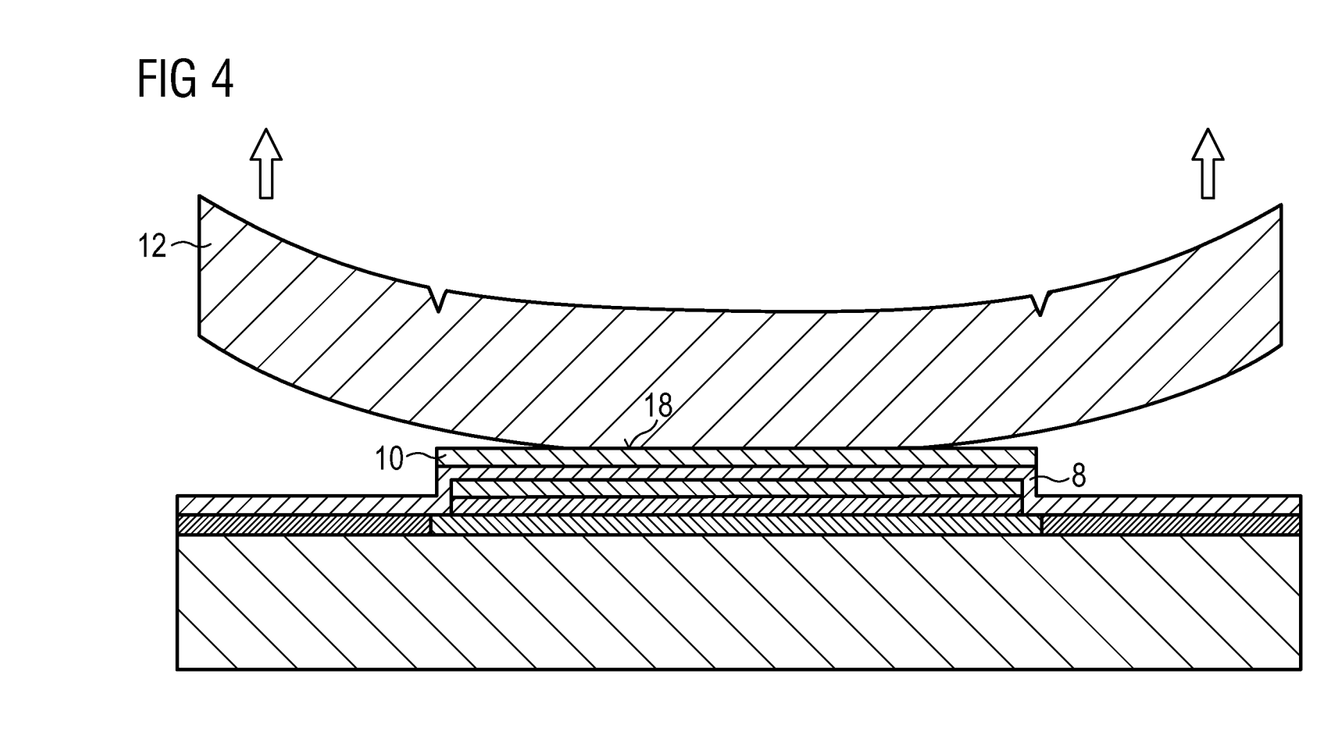
FIGS. 4 to 9 show schematic illustrations of optoelectronic components in accordance with further exemplary embodiments.
Figure 5:
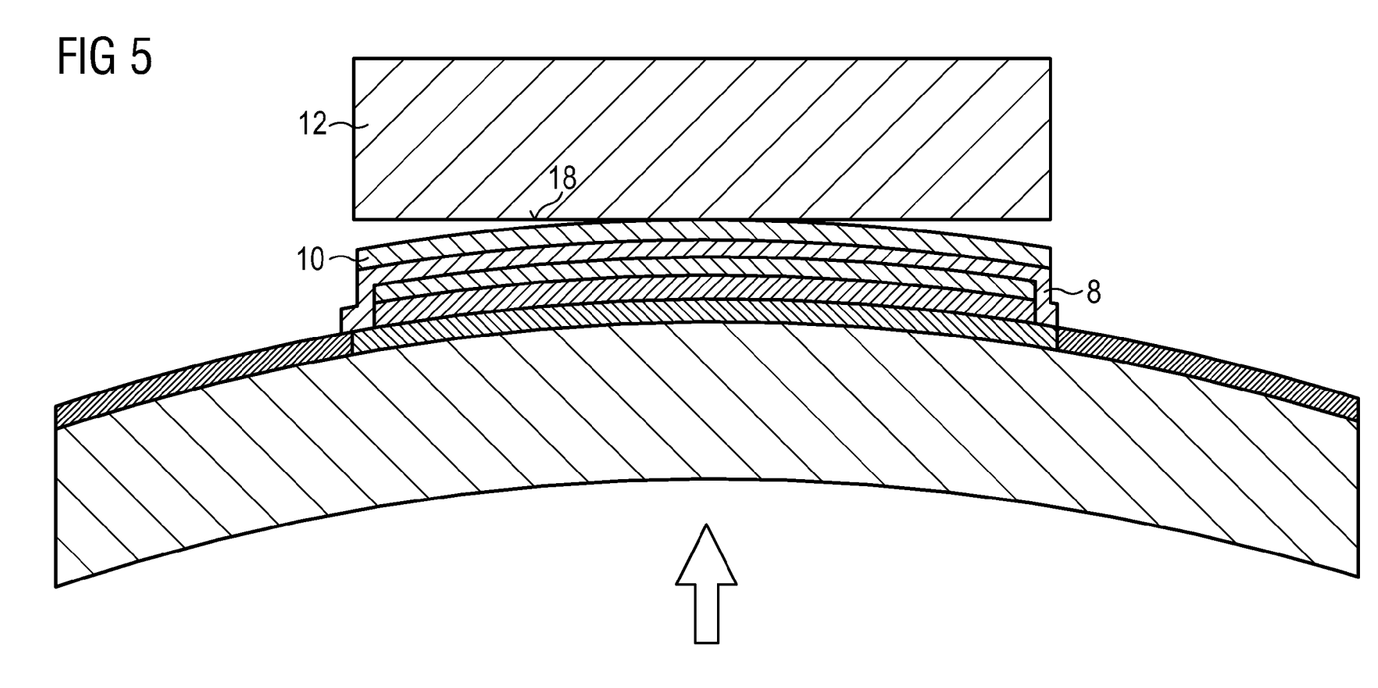

FIGS. 4 and 5 show how an adhesion failure takes place at the predetermined breaking surface 18 if the predetermined breaking surface 18 coincides with the interface between the lamination adhesive layer 10 and the lamination substrate layer 12, as is also illustrated in FIG. 1.

The adhesion forces are coordinated with regard to the respective interfaces in such a way that upon the occurrence of tensile forces running in a direction perpendicular to the plane of the thin-film encapsulation layer 8, the lamination substrate layer 12 detaches from the lamination adhesive layer 10, while the lamination adhesive layer 10 remains adhering completely to the thin-film encapsulation layer 8, as a result of which the interface between the lamination adhesive layer 10 and the thin-film encapsulation layer 8 remains undamaged. A similar mechanism also takes effect upon the occurrence of shear stresses.

More precisely, the adhesion force between the lamination adhesive layer 10 and the thin-film encapsulation layer 8 is greater (for example, greater than or equal to 50 N/cm) than the adhesion force between the lamination adhesive layer 10 and the lamination substrate layer 12 (for example, less than or equal to 30 N/cm). Furthermore, the cohesion force acting in each case in the relevant layers (thin-film encapsulation layer 8, lamination adhesive layer 10 and lamination substrate layer 12) is greater than the adhesion force between the lamination adhesive layer 10 and the lamination substrate layer 12, such that undesirable splitting of said layers is avoided.

If a tensile stress then occurs, the lamination substrate layer 12 detaches from the lamination adhesive layer 10, for example, proceeding from an edge of the lamination adhesive layer 10, wherein the adhesion failure gradually progresses in the direction of an opposite edge along a plane running perpendicular to the tensile stress.

Figure 6:
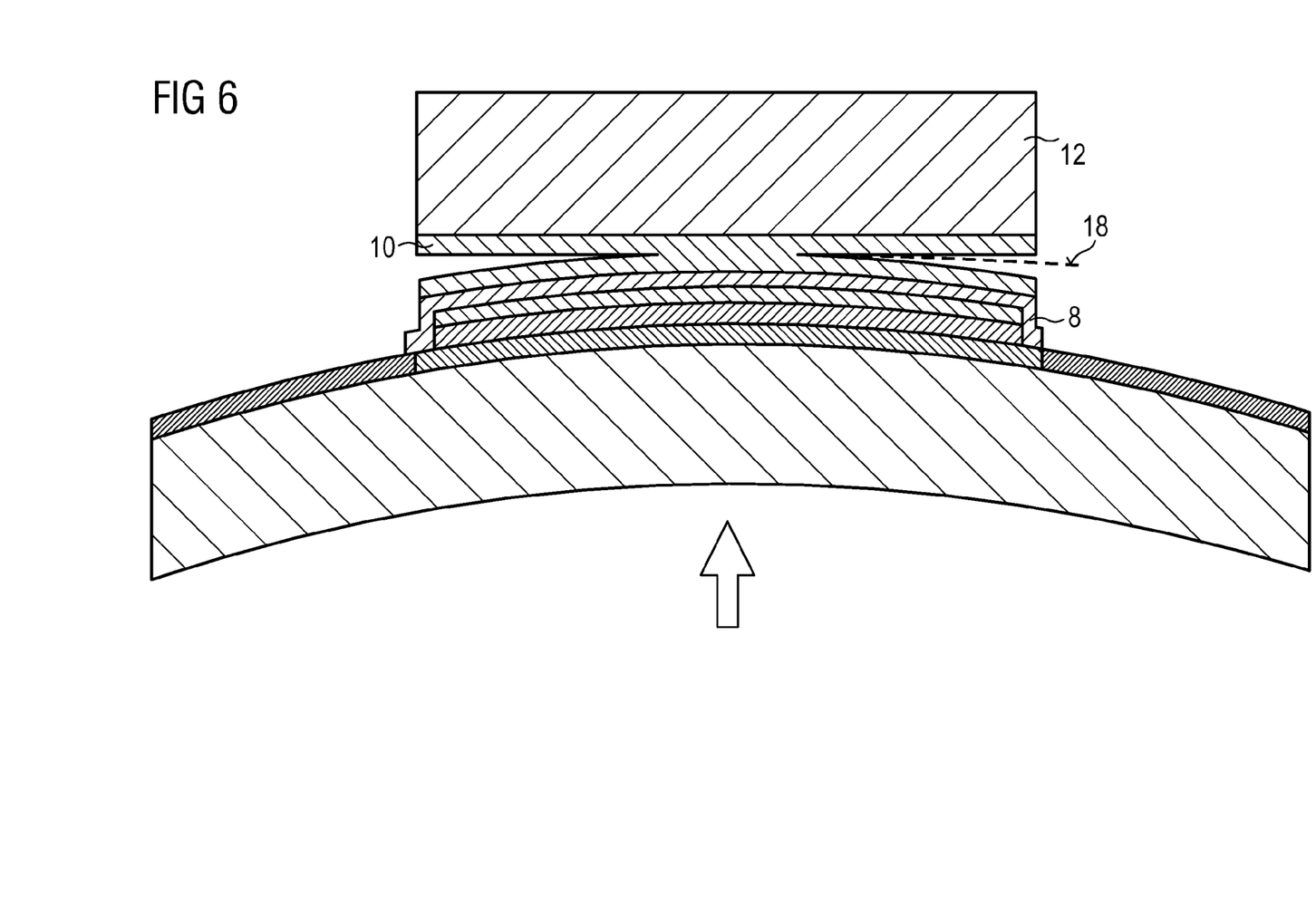

In accordance with a further embodiment, illustrated in FIG. 6, the predetermined breaking surface 18 runs within the lamination adhesive layer 10. In this case, in the event of mechanical loading a cohesion failure takes place within the lamination adhesive layer 10. This has the consequence that the latter splits into two separate partial layers, one of which remains adhering to the thin-film encapsulation layer 8, while the other partial layer remains adhering to and accompanies the lamination substrate layer 12.

More precisely, provision is made for a cohesion force within the lamination adhesive layer 10 to be less than the adhesion force between the lamination adhesive layer 10 and the thin-film encapsulation layer 8. Furthermore, the cohesion force acting in each of the other relevant layers (thin-film encapsulation layer 8 and lamination substrate layer 12) and also the adhesion forces at the various interfaces are greater than the cohesion force of the lamination adhesive layer 10.

In this way, a splittable lamination adhesive layer 10 is provided, such that the interface between the lamination adhesive layer 10 and the thin-film encapsulation layer 8 is not impaired in the event of any mechanical loading.

Figure 7:
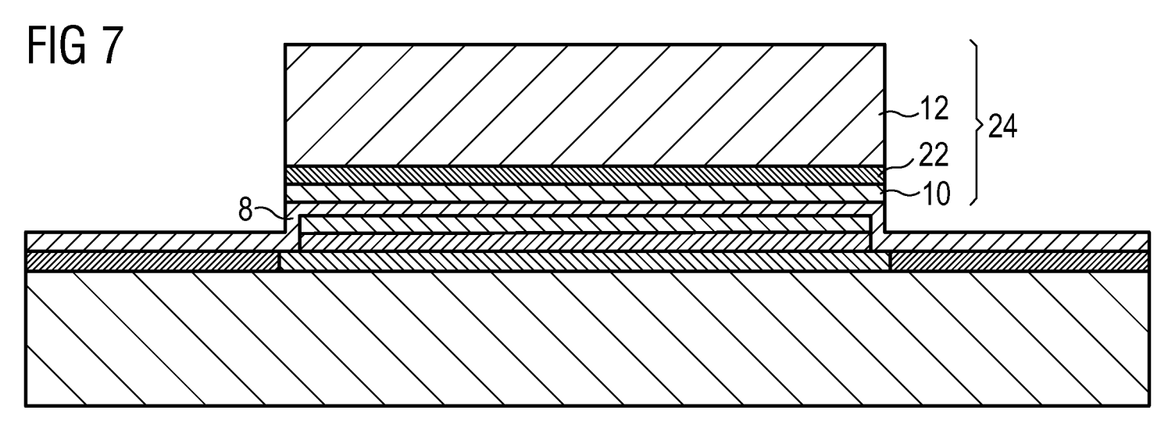

FIG. 7 illustrates an optoelectronic component in accordance with a further embodiment. In contrast to the embodiments illustrated in FIG. 1 and FIGS. 4-6, an additional intermediate layer 22 is arranged between the lamination adhesive layer 10 and the lamination substrate layer 12, such that the covering layer 24 is formed by the three layers 10, 12, 22 mentioned. By means of suitable setting of the adhesion and/or cohesion properties, it is possible to form the predetermined breaking surface 18 in different planes of the covering layer 24.

Figure 8:
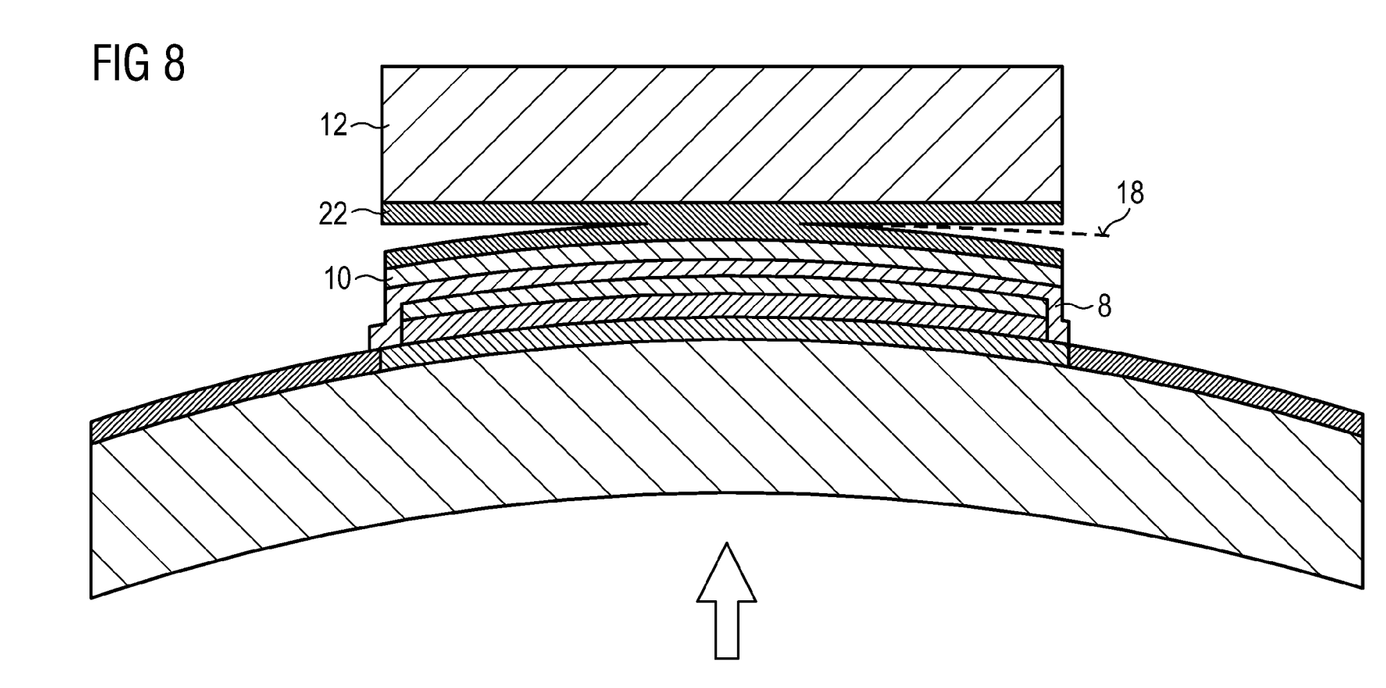

In the embodiment illustrated in FIG. 8, the predetermined breaking surface 18 runs within the intermediate layer 22. In this case, in the event of mechanical loading a cohesion failure takes place within the intermediate layer 22. This has the consequence that the latter splits into two separate partial layers, one of which remains adhering to the lamination adhesive layer 10 and thus together with the latter to the thin-film encapsulation layer 8, while the other partial layer remains adhering to and accompanies the lamination substrate layer 12.

Figure 9:
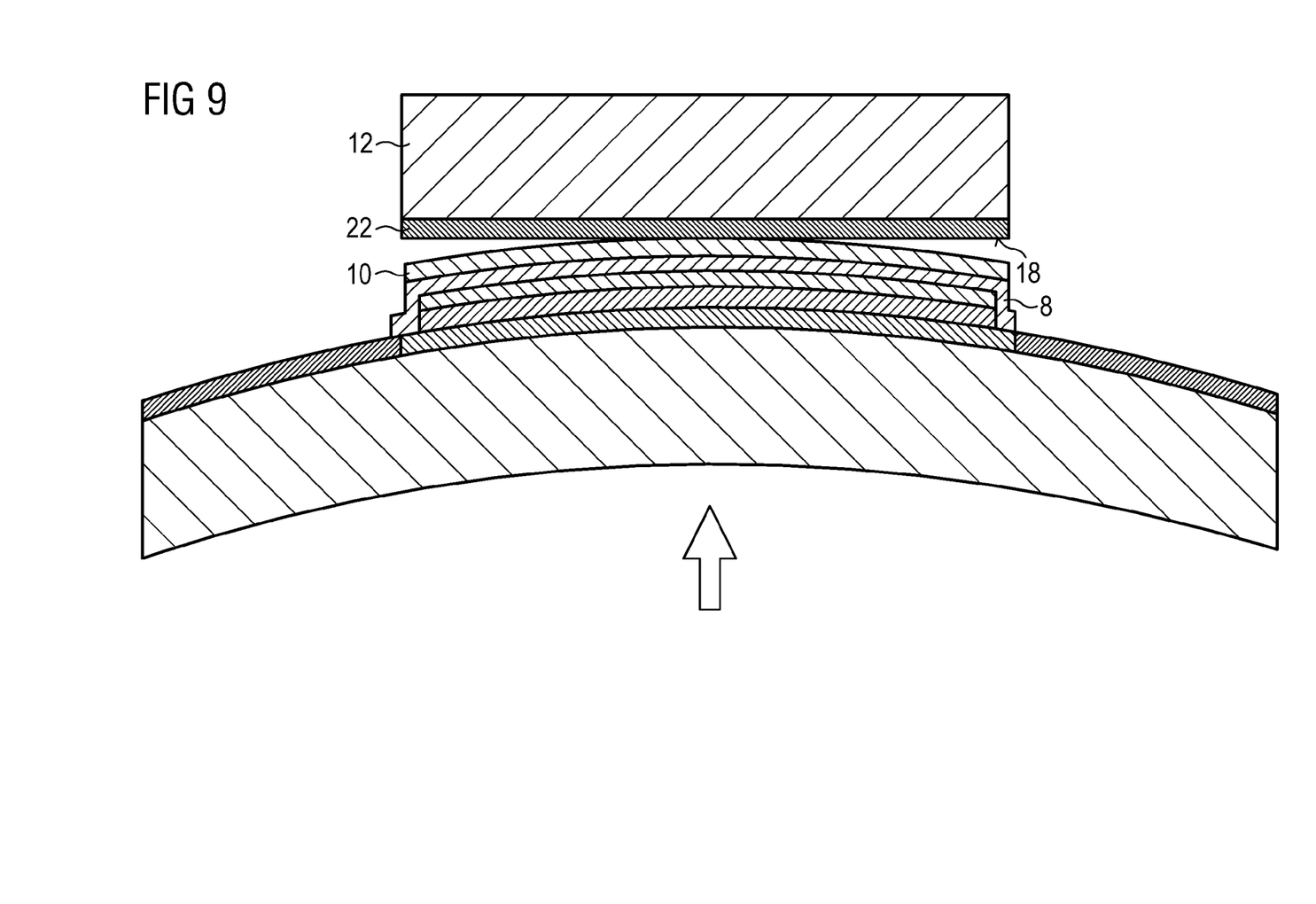

In the embodiment illustrated in FIG. 9, the predetermined breaking surface 18 runs at the interface between the intermediate layer 22 and the lamination adhesive layer 10. The adhesion forces are coordinated with regard to the respective interfaces in such a way that upon the occurrence of tensile stresses which run in a direction perpendicular to the plane of the thin-film encapsulation layer 8, the intermediate layer 22 detaches from the lamination adhesive layer 10, while the lamination adhesive layer 10 remains adhering completely to the thin-film encapsulation layer 8, as a result of which the interface between the lamination adhesive layer 10 and the thin-film encapsulation layer 8 remains undamaged.

The invention claimed is:

1. An optoelectronic component comprising:
    a substrate;
    a first electrode on the substrate;
    a radiation-emitting or radiation-absorbing layer sequence on the first electrode,
    a second electrode on the layer sequence;
    an encapsulation layer on the second electrode; and
    a covering layer on the encapsulation layer and having a first and a second main surface,
    wherein at least one predetermined breaking surface is provided between the first and the second main surface of the covering layer, and
    wherein the optoelectronic component further comprises one of the following features:
        i. the encapsulation layer is embodied as a thin-film encapsulation layer having a thickness of less than 10 micrometers,
        ii. the covering layer comprises a plurality of individual layer elements, wherein two adjacent individual layer elements are connected to one another via a cohesive connection that is configured in such a way that the predetermined breaking surface is formed at least partly by an interface between the two adjacent individual layer elements,
        iii. the covering layer is arranged directly on the encapsulation layer, wherein an adhesion between the covering layer and the encapsulation layer is high enough that the covering layer remains adhered to the encapsulation layer in the event of a mechanical loading of the optoelectronic component,
        iv. the covering layer comprises an adhesive layer and a cover substrate layer arranged on the adhesive layer, wherein the adhesive layer is arranged directly on the encapsulation layer, and wherein an adhesion between the adhesive layer and the encapsulation layer is high enough that the adhesive layer remains adhered to the encapsulation layer in the event of a mechanical loading of the optoelectronic component, and
        v. the covering layer comprises an adhesive layer and a cover substrate layer, wherein the cover substrate layer is arranged directly on the adhesive layer, and wherein the optoelectronic component is configured so that an adhesion failure takes place at an interface between the adhesive layer and the cover substrate layer in the event of a mechanical loading of the optoelectronic component.

2. The optoelectronic component according to claim 1, wherein the layer sequence comprises one or a plurality of functional layers composed of organic material.

3. The optoelectronic component according to claim 1, wherein the layer sequence comprises an active region that emits electromagnetic radiation during operation.

4. The optoelectronic component according to claim 1, wherein the encapsulation layer is configured to protect the electrodes and the layer sequence against moisture and/or oxygen.

5. The optoelectronic component according to claim 1, wherein the optoelectronic component is configured so that a cohesion failure takes place at the predetermined breaking surface in response to a mechanical loading of the optoelectronic component.

6. The optoelectronic component according to claim 1, wherein the optoelectronic component comprises the ii, and wherein the optoelectronic component is configured so that the adhesion failure takes place at the interface between the two adjacent individual layer elements in response to the mechanical loading of the optoelectronic component.

7. The optoelectronic component according to claim 1, wherein the predetermined breaking surface extends parallel to an interface between the covering layer and the encapsulation layer.

8. An optoelectronic component comprising:
    a substrate;
    a first electrode on the substrate;
    a radiation-emitting or radiation-absorbing layer sequence on the first electrode;
    a second electrode on the layer sequence;
    an encapsulation layer arranged on the second electrode; and
    a covering layer arranged on the encapsulation layer and having a first and a second main surface; and
    a predetermined breaking surface between the first and the second main surface of the covering layer, wherein the predetermined breaking surface is configured so that, in the event of a mechanical loading of the optoelectronic component, a cohesion failure takes place at the at least one predetermined breaking surface.

9. The optoelectronic component according to claim 8, wherein the covering layer comprises an adhesive layer and a cover substrate layer arranged on the adhesive layer.

10. The optoelectronic component according to claim 9, wherein the optoelectronic component is configured so that the cohesion failure takes place in the adhesive layer.

11. The optoelectronic component according to claim 9, wherein an intermediate layer is arranged between the adhesive layer and the cover substrate layer and wherein the optoelectronic component is configured so that, in the event of a mechanical loading of the optoelectronic component, a cohesion failure takes place in the intermediate layer or an adhesion failure takes place at an interface between the intermediate layer and the adhesive layer or at an interface between the intermediate layer and the cover substrate layer.

12. An optoelectronic component comprising:
    a substrate;
    a first electrode on the substrate;

a radiation-emitting or radiation-absorbing layer sequence on the first electrode;
a second electrode on the layer sequence;
an encapsulation layer on the second electrode;
a covering layer on the encapsulation layer, the cover layer having a first and a second main surface; and
a predetermined breaking surface between the first and the second main surface of the covering layer;
wherein the covering layer comprises an adhesive layer and a cover substrate layer on the adhesive layer;
wherein an intermediate layer is arranged between the adhesive layer and the cover substrate layer; and
wherein the optoelectronic component is configured so that, in case of a mechanical loading of the optoelectronic component, one of the following events happens: a cohesion failure takes place in the intermediate layer, or an adhesion failure takes place at an interface between the intermediate layer and the adhesive layer, or an adhesion failure takes place at an interface between the intermediate layer and the cover substrate layer, or combinations thereof.

13. The optoelectronic component according to claim 12, wherein the component is configured in such a way that in case of a mechanical loading of the optoelectronic component a cohesion failure takes place in the intermediate layer.

14. The optoelectronic component according to claim 12, wherein the component is configured in such a way that in case of a mechanical loading of the optoelectronic component an adhesion failure takes place at an interface between the intermediate layer and the adhesive layer.

15. The optoelectronic component according to claim 12, wherein the component is configured in such a way that in case of a mechanical loading of the optoelectronic component an adhesion failure takes place at an interface between the intermediate layer and the cover substrate layer.

* * * * *